United States Patent
Xiong

(10) Patent No.: US 10,217,770 B2
(45) Date of Patent: Feb. 26, 2019

(54) PIXEL UNIT, COA SUBSTRATE AND LIQUID CRYSTAL DISPLAY PANEL HAVING THE SAME

(71) Applicant: SHENZHEN CHINA STAR OPTOELECTRONICS TECHNOLOGY CO., LTD., Shenzhen (CN)

(72) Inventor: Yuan Xiong, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 531 days.

(21) Appl. No.: 14/779,689

(22) PCT Filed: Aug. 7, 2015

(86) PCT No.: PCT/CN2015/086376
§ 371 (c)(1),
(2) Date: Sep. 24, 2015

(87) PCT Pub. No.: WO2017/015985
PCT Pub. Date: Feb. 2, 2017

(65) Prior Publication Data
US 2018/0083037 A1 Mar. 22, 2018

(30) Foreign Application Priority Data
Jul. 24, 2015 (CN) .......................... 2015 1 0443780

(51) Int. Cl.
G02F 1/1362 (2006.01)
H01L 27/12 (2006.01)
G02F 1/1368 (2006.01)
G09G 3/36 (2006.01)

(52) U.S. Cl.
CPC .......... *H01L 27/124* (2013.01); *G02F 1/1368* (2013.01); *G02F 1/136227* (2013.01); *G09G 3/3648* (2013.01); *G02F 1/136286* (2013.01); *G02F 2001/136222* (2013.01)

(58) Field of Classification Search
CPC .......................................... G02F 2001/136222
See application file for complete search history.

(56) References Cited

U.S. PATENT DOCUMENTS

| | | | | |
|---|---|---|---|---|
| 2011/0049519 A1* | 3/2011 | Kim | .................. | G02F 1/13624 257/59 |
| 2012/0248444 A1* | 10/2012 | Kang | .................. | H01L 27/1292 257/59 |

* cited by examiner

*Primary Examiner* — Kendrick Hsu
(74) *Attorney, Agent, or Firm* — Osha Liang LLP

(57) ABSTRACT

A pixel unit, a COA substrate and a liquid crystal display panel having the same are provided. In the pixel unit, a plurality of bridging holes share a color resist opening and a spacing between two adjacent bridging holes is less than a sum of conventional spacings separately corresponding to the two adjacent bridging holes. With the pixel unit, the space occupied by the color resist opening can be reduced, the space utilization of a TFT region is further improved, and the aperture opening ratio is increased.

8 Claims, 3 Drawing Sheets

PIXEL UNIT, COA SUBSTRATE AND LIQUID CRYSTAL DISPLAY PANEL HAVING THE SAME

BACKGROUND OF THE INVENTION

Field of the Invention

The present invention relates to the technical field of liquid crystal displays, and more particularly to a pixel unit, a COA substrate and a liquid crystal display panel having the same.

Description of the Related Art

In a COA (Color filter On Array, where a color film layer is directly formed on an array substrate) framework, to ensure the electrical connection of two different conductive layers, such as M1 (a first metal layer)/M2 (a second metal layer), M1/ITO (an indium tin oxide layer) and M2/ITO, it is required to provide bridging holes in corresponding conductive layers; and to further ensure the bridging holes not to be covered by color resist or for ease of electrical conduction of the conductive layers (e.g., electrical conduction of M2/ITO), for each bridging hole, it is required to separately provide a color-resist opening within a region of a color resist layer corresponding to this bridging hole.

However, due to different manufacture procedures of different conductive layers and different manufacture procedures of bridging holes and color-resist openings, to ensure an overlapping ratio of bridging holes on a conductive layer and color-resist openings on a color resist layer to be within a certain range, the aperture of the color-resist opening is required to be far greater than that of the bridging holes and a single color-resist opening thus occupies a large space.

It can be seen that, since it is required to separately provide a color-resist opening hole with respect to each bridging hole and a single color-resist opening occupies a large space, the color-resist openings will occupy a large amount of space in the TFT layout design. As a result, both the space utilization and the aperture opening ratio of a TFT (Thin Film Transistor) region are reduced.

For example, as shown in FIG. 1, a pixel unit includes a color resist layer 10 and a pixel electrode 11. When there are two bridging holes in the pixel unit, i.e., a first bridging hole 101 and a second bridging hole 102, it is required to separately provide two corresponding color resist openings on the color resist layer 10, i.e., a first color resist opening 103 and a second color resist opening 104. Meanwhile, since the distance from an edge of each color resist opening to an edge of each of the bridging holes, i.e., a spacing between each of the color resist openings and each of the bridging holes, has certain requirements, that is, both a spacing d1 between the first color resist opening 103 and the first bridging hole 101 and a spacing d2 between the second color resist opening 104 and the second bridging hole 102 in FIG. 1 have certain requirements, the color resist openings in the pixel unit will occupy a large amount of space. As a result, both the space utilization and the aperture opening ratio of the TFT region are reduced.

SUMMARY OF THE INVENTION

An objective of the present invention is to provide a pixel unit, a COA substrate and a liquid crystal display panel, in order to solve a technical problem, in the prior art, that color resist openings occupy a large amount of space and both the space utilization and the aperture opening ratio of a TFT region are thus reduced.

In order to solve the above technical problem, the present invention proposes the following technical solutions:

A pixel unit is provided and includes:

a thin film transistor configured to control, according to the scanning signal, whether to transmit the data signal to a corresponding pixel electrode through a drain of the thin film transistor;

a color resist layer, which has an actual color resist opening and is configured to form a color filter;

a plurality of bridging holes for electrical connection, each of which corresponds to a conventional spacing that is a spacing between a conventional color resist opening to which this bridging hole corresponds and this bridging hole;

a pixel electrode disposed on the color resist layer and electrically connected to the drain of the thin film transistor through one of the bridging holes, the pixel electrode being configured to control corresponding liquid crystal molecules according to the data signal, wherein the plurality of bridging holes in the first pixel unit are included in the actual color resistor opening; and a spacing between two adjacent bridging holes is less than a sum of conventional spacings separately corresponding to the two adjacent bridging holes.

In the pixel unit of the present invention, the sum of conventional spacings separately corresponding to the two adjacent bridging holes is greater than 14 µm, and the spacing between the two adjacent bridging holes is less than 14 µm.

In the pixel unit of the present invention, the thin film transistor includes:

a gate;

a gate insulating layer disposed on the gate;

a semiconductor layer disposed on the gate insulating layer and configured to form a channel of the thin film transistor; and a source and the drain being located on two sides of the semiconductor layer, respectively; wherein the color resistor layer disposed on the drain and the gate insulating layer.

In the pixel unit of the present invention, the pixel unit includes a first bridging hole and a second bridging hole, and the first bridging hole is adjacent to the second bridging hole; and a spacing between the first bridging hole and the second bridging hole is less than a sum of the conventional spacing corresponding to the first bridging hole and the conventional spacing corresponding to the second bridging hole.

In the pixel unit of the present invention, the spacing between two adjacent bridging holes is less than 14 µm but greater than 7 µm.

A COA substrate is further provided and includes:

a substrate:

a scanning line, a data line and a first pixel unit formed on the substrate, wherein the data line is configured to transmit a data signal;

the scanning line is configured to transmit a scanning signal; and the first pixel unit is configured to display a picture according to the data signal line and includes:

a thin film transistor configured to control, according to the scanning signal, whether to transmit the data signal to a corresponding pixel electrode through a drain of the thin film transistor;

a color resist layer, which has an actual color resist opening and is configured to form a color filter;

a plurality of bridging holes for electrical connection, each of which corresponds to a conventional spacing that is a spacing between a conventional color resist opening to which this bridging hole corresponds and this bridging hole;

a pixel electrode disposed on the color resist layer and electrically connected to the drain of the thin film transistor through one of the bridging holes, the pixel electrode being configured to control corresponding liquid crystal molecules according to the data signal, wherein the plurality of bridging holes in the first pixel unit are included in the actual color resistor opening; and a spacing between two adjacent bridging holes is less than a sum of conventional spacings separately corresponding to the two adjacent bridging holes.

In the COA substrate of the present invention, a second pixel unit is further formed on the substrate;

the second pixel unit is configured to display a picture according to the data signal, and the second pixel unit is adjacent to the first pixel unit and has at least one of the bridging holes;

the at least one of the bridging holes in the second pixel unit is included in the actual color resist opening; and a spacing between two adjacent bridging holes which belong to different pixel units is less than a sum of conventional spacings separately corresponding to the two adjacent bridging holes.

In the COA substrate of the present invention, the second pixel unit has one bridging hole located within the actual color resist opening and adjacent to one of the bridging holes of the first pixel unit.

In the COA substrate of the present invention, the sum of conventional spacings separately corresponding to the two adjacent bridging holes is greater than 14 μm, and the spacing between the two adjacent bridging holes is less than 14 μm.

In the COA substrate of the present invention, the thin film transistor includes:

a gate;

a gate insulating layer disposed on the gate;

a semiconductor layer disposed on the gate insulating layer and configured to form a channel of the thin film transistor; and a source and the drain being located on two sides of the semiconductor layer, respectively; wherein the color resistor layer disposed on the drain and the gate insulating layer.

In the COA substrate of the present invention, the first pixel unit comprises a first bridging hole and a second bridging hole, and the first bridging hole is adjacent to the second bridging hole; and the spacing between the first bridging holes and the second bridging hole is less than a sum of the conventional spacing corresponding to the first bridging hole and the conventional spacing corresponding to the second bridging hole.

In the COA substrate of the present invention, the second pixel unit has two adjacent bridging holes both located within the actual color resist opening, and one of the two adjacent bridging holes is adjacent to one of the bridging holes of the first pixel unit.

In the COA substrate of the present invention, the spacing between two adjacent bridging holes is less than 14 μm but greater than 7 μm.

The embodiment of the present invention further provides a liquid crystal display panel including a COA substrate, a glass substrate and a liquid crystal layer disposed between the COA substrate and the glass substrate, wherein the COA substrate includes:

a substrate:

a scanning line, a data line and a first pixel unit all formed on the substrate, wherein, the data line is configured to transmit a data signal;

the scanning line is configured to transmit a scanning signal; and the first pixel unit is configured to display a picture according to the data signal line and comprises:

a thin film transistor configured to control, according to the scanning signal, whether to transmit the data signal to a corresponding pixel electrode through a drain of the thin film transistor;

a color resist layer, which has an actual color resist opening and is configured to form a color filter;

a plurality of bridging holes for electrical connection, each of which corresponds to a conventional spacing that is a spacing between a conventional color resist opening to which this bridging hole corresponds and this bridging hole; and a pixel electrode disposed on the color resist layer and electrically connected to the drain of the thin film transistor through one of the bridging holes, the pixel electrode being configured to control corresponding liquid crystal molecules according to the data signal, wherein, the plurality of bridging holes in the first pixel unit are included in the actual color resistor opening; and a spacing between two adjacent bridging holes is less than a sum of conventional spacings separately corresponding to the two adjacent bridging holes.

In the liquid crystal display panel of the present invention, a second pixel unit is further formed on the substrate;

the second pixel unit is configured to display a picture according to the data signal, and the second pixel unit is adjacent to the first pixel unit and has at least one of the bridging holes;

the at least one of the bridging holes in the second pixel unit is included in the actual color resist opening; and a spacing between two adjacent bridging holes which belong to different pixel units is less than a sum of conventional spacings separately corresponding to the two adjacent bridging holes.

In the liquid crystal display panel of the present invention, the second pixel unit has one bridging hole located within the actual color resist opening and adjacent to one of the bridging holes of the first pixel unit.

In the liquid crystal display panel of the present invention, the sum of conventional spacings separately corresponding to the two adjacent bridging holes is greater than 14 μm, and the spacing between the two adjacent bridging holes is less than 14 μm.

In the liquid crystal display panel of the present invention, the spacing between two adjacent bridging holes is less than 14 μm but greater than 7 μm.

In the liquid crystal display panel of the present invention, the thin film transistor includes:

a gate;

a gate insulating layer disposed on the gate;

a semiconductor layer disposed on the gate insulating layer and configured to form a channel of the thin film transistor; and a source and the drain being located on two sides of the semiconductor layer, respectively; wherein the color resistor layer disposed on the drain and the gate insulating layer.

In the liquid crystal display panel of the present invention, the first pixel unit comprises a first bridging hole and a second bridging hole, and the first bridging hole is adjacent to the second bridging hole; and the spacing between the first bridging holes and the second bridging hole is less than a sum of the conventional spacing corresponding to the first bridging hole and the conventional spacing corresponding to the second bridging hole.

The present invention provides a pixel unit, a COA substrate and a liquid crystal display panel having the same. A plurality of bridging holes in the pixel unit are all included in an actual color resist opening, and a spacing between two adjacent bridging holes is less than a sum of conventional spacings separately corresponding to the two adjacent bridging holes. Thus it can be seen that the plurality of bridging holes in the pixel unit provided by the present invention may share a color resist opening, and the spacing between two adjacent bridging holes is less than a sum of conventional spacings separately corresponding to the two adjacent bridging holes. Therefore, the space occupied by the shared color resist opening is less than a sum of spaces occupied by conventional color resist openings corresponding to the plurality of bridging holes. Compared with the prior art, with the pixel unit of the present invention, a space occupied by the color resist opening may be reduced, the space utilization of a TFT region is further improved, and the aperture opening ratio is improved.

DETAILED DESCRIPTION OF THE PREFERRED EMBODIMENTS

The foregoing objects, features and advantages adopted by the present invention can be best understood by referring to the following detailed description of the preferred embodiments and the accompanying drawings. Furthermore, the directional terms described in the present invention, such as upper, lower, front, rear, left, right, inner, outer, side and etc., are only directions referring to the accompanying drawings, so that the used directional terms are used to describe and understand the present invention, but the present invention is not limited thereto.

First Embodiment

Figure 1:
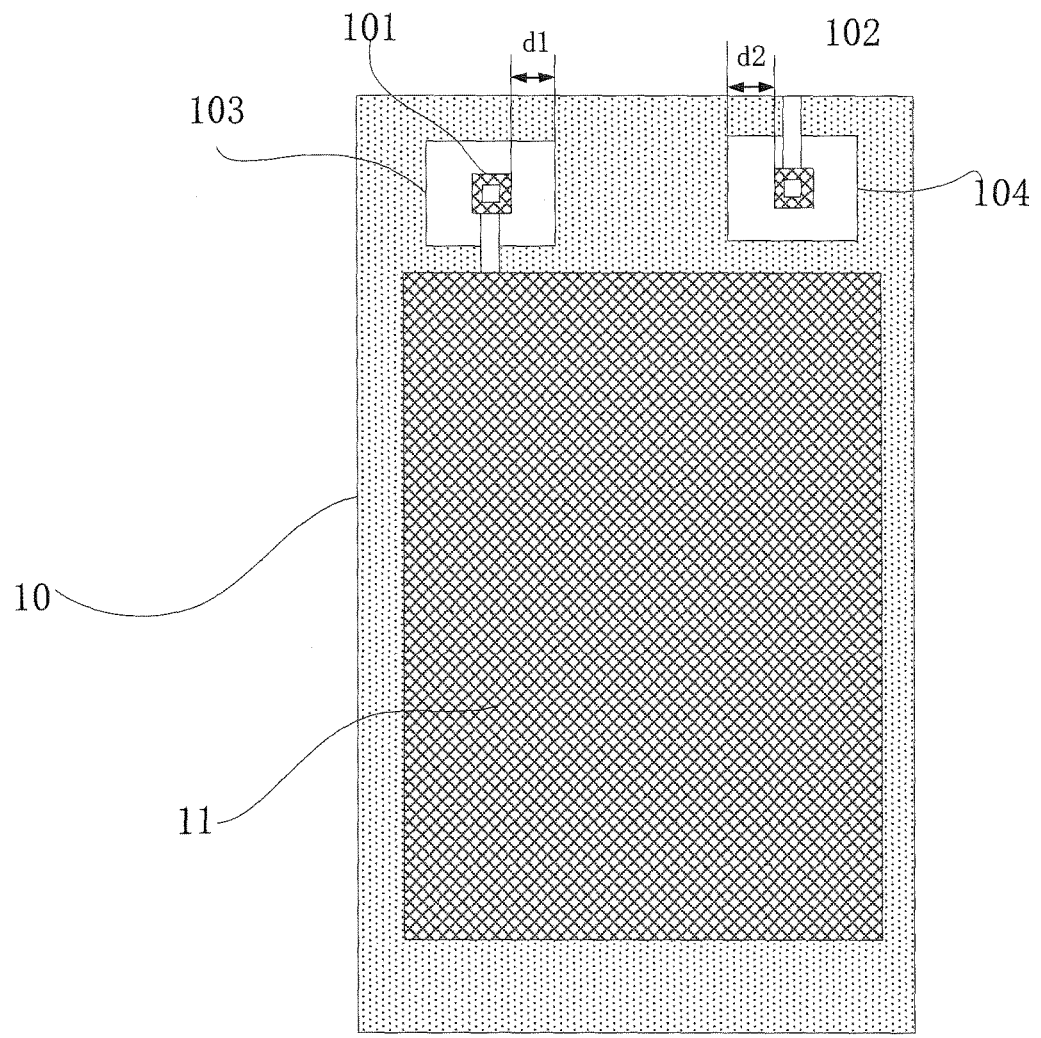
FIG. 1 is a schematic diagram of color resist openings in an existing design.
Figure 2:
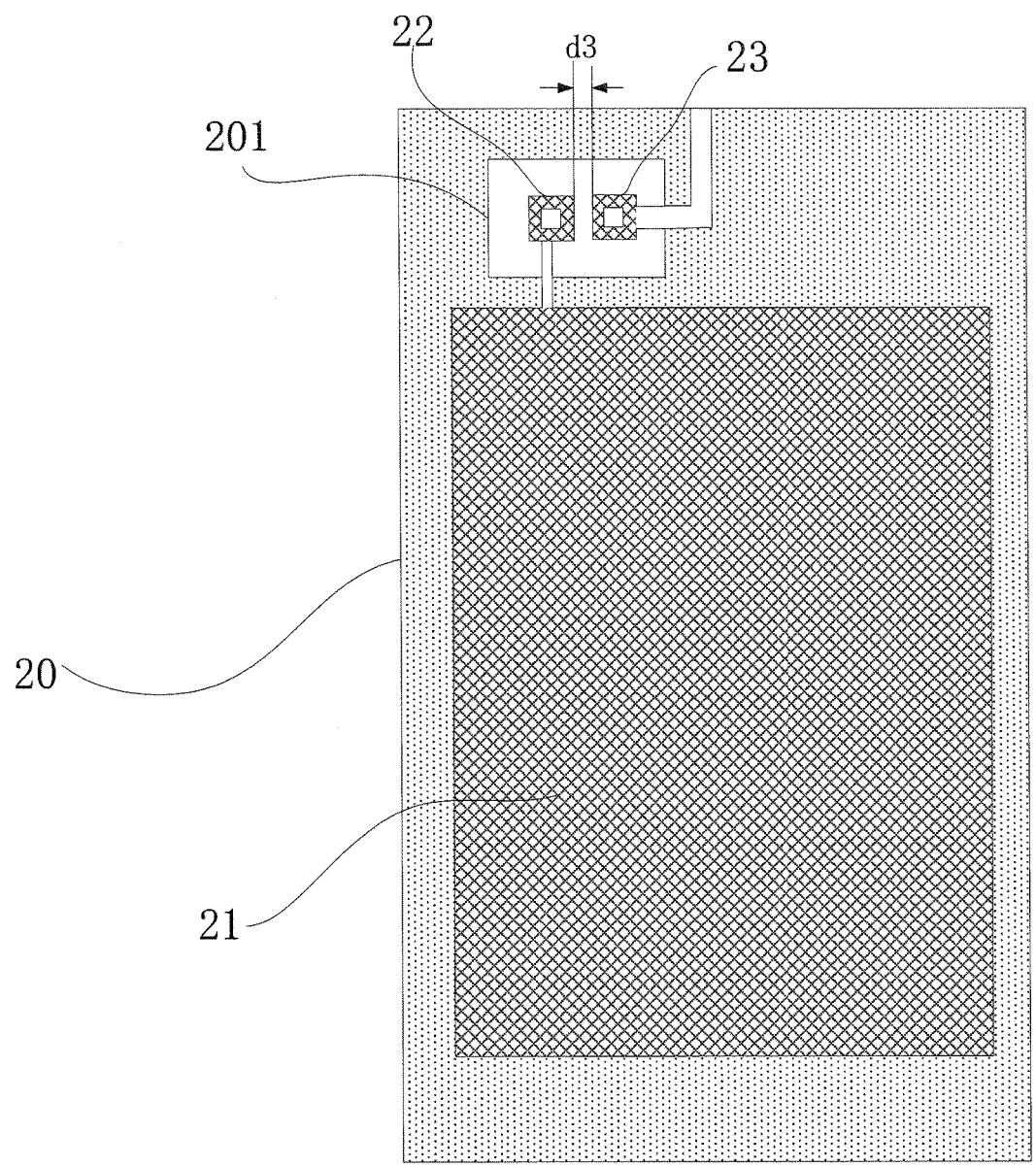
FIG. 2 is a design diagram of color resist openings in a pixel unit according to a first embodiment of the present invention.

As shown in FIG. 2, this embodiment provides a pixel unit, including:

a thin film transistor (not shown) configured to control, according to a scanning signal, whether to transmit a data signal to a corresponding pixel electrode through a drain of the thin film transistor, wherein, the thin film transistor includes a gate formed of a first metal layer, a gate insulating layer, a semiconductor layer, a source formed of a second metal layer, and a drain, wherein the gate receives a scanning signal transmitted by a scanning line and the source receives a data signal transmitted by a data line;

the gate insulating layer is disposed on the gate; and the semiconductor layer is disposed on the gate insulating layer and configured to form a channel of the thin film transistor; and the source and the drain are located on two sides of the semiconductor layer, respectively;

a color resist layer 20, which has an actual color resist opening 201 and is configured to form a color filter, wherein, specifically, the color resistor layer 20 may be disposed on the drain and the gate insulating layer; and, preferably, in this embodiment, the actual color resist opening 201 may be rectangular and bridging holes may be rectangular;

a plurality of bridging holes for electrical connection, each of which corresponds to a conventional spacing that is a spacing between a conventional color resist opening to which this bridging hole corresponds and this bridging hole, wherein, taking two bridging holes (i.e., a first bridging hole 22 and a second bridging hole 23) as example in this embodiment, the first bridging hole 22 may be a bridging hole for the electrical connection of a pixel electrode 21 and the drain of the thin film transistor, and the second bridging hole 23 may be a bridging hole for the electrical connection of the drain or source of the thin film transistor and other layers, other electrodes or other wirings;

it should be understood that the pixel unit in other embodiments may have three, four or more than four bridging holes, and the specific number of the bridging holes is set according to actual needs; and in this embodiment, each bridging hole corresponds to a conventional color resist opening that is a color resist opening having a distance from its edge to an edge of the bridging hole meeting certain requirements, i.e., a color resist opening having a spacing from the bridging hole reaching a preset spacing, wherein the preset spacing is the conventional spacing;

a pixel electrode 21 disposed on the color resist layer 20 and electrically connected to the drain of the thin film transistor through one of the bridging holes (through the bridging hole 22 in FIG. 2), the pixel electrode being configured to control corresponding liquid crystal molecules according to the data signal, wherein, the plurality of bridging holes are all included in the actual color resistor opening, that is, both the first bridging hole 22 and the second bridging hole 23 are included in the actual color resist opening 201 in FIG. 2; and a spacing between two adjacent bridging holes is less than a sum of conventional spacings separately corresponding to the two adjacent bridging holes, wherein, specifically, referring to FIG. 1, the conventional spacing corresponding to the first bridging hole 22 may be d1, and the conventional spacing corresponding to the second bridging hole 23 may be d2; and referring to FIG. 2, the spacing between the first bridging hole 22 and the second bridging hole 23 is d3;

wherein, $d3<d1+d2$; and, in practical applications, $d1+d2$ is generally greater than 14 μm and d3 is thus less than 14 μm.

Preferably, for ease of arrangement of wiring and design of TFT layout, in this embodiment, d3 is greater than 7 μm but less than 14 μm.

In this embodiment, the first bridging hole 22 and the second bridging hole 23 share an actual color opening 202, and $d3<d1+d2$. The regions occupied by d1 and d2 may be condensed as a region occupied by d3, so that the space occupied by the color resist openings may be reduced, the space utilization of a TFT region may be improved, and the aperture opening ratio may be improved.

Similarly, in other embodiments where the pixel unit includes three, four or more than four bridging holes, the space occupied by the color resist openings may also be reduced, the space utilization of the TFT region may be improved, and the aperture opening ratio may be improved.

Second Embodiment

This embodiment provides a COA substrate, including:

a substrate:

a scanning line, a data line and a first pixel unit all formed on the substrate, wherein, the data line is configured to transmit a data signal;

the scanning line is configured to transmit a scanning signal; and referring to FIG. 2, the first pixel unit is configured to display a picture according to the data signal line and includes:

a thin film transistor configured to control, according to the scanning signal, whether to transmit the data signal to a corresponding pixel electrode through a drain of the thin film transistor;

a color resist layer 20, which has an actual color resist opening 201 and is configured to form a color filter;

a plurality of bridging holes for electrical connection, each of which corresponds to a conventional spacing that is a spacing between a conventional color resist opening to which this bridging hole corresponds and this bridging hole, wherein, taking two bridging holes (i.e., a first bridging hole 22 and a second bridging hole 23) as example in this embodiment, the first bridging hole 22 may be a bridging hole for the electrical connection of a pixel electrode 21 and the drain of the thin film transistor, and the second bridging hole 23 may be a bridging hole for the electrical connection of the drain or source of the thin film transistor and other layers, other electrodes or other wirings;

a pixel electrode 21 disposed on the color resist layer 20 and electrically connected to the drain of the thin film transistor through one of the bridging holes (through the bridging hole 22 in FIG. 2), the pixel electrode being configured to control corresponding liquid crystal molecules according to the data signal, wherein, the plurality of bridging holes are all included in the actual color resistor opening, that is, both the first bridging hole 22 and the second bridging hole 23 are included in the actual color resist opening 201 in FIG. 2; and a spacing between two adjacent bridging holes is less than a sum of conventional spacings separately corresponding to the two adjacent bridging holes, that is, d3<d1+d2.

In this embodiment, the design of the color resist openings in the first pixel unit may refer to the design of the color resist openings in the pixel unit in FIG. 2. In this embodiment, by adjusting the position of the bridging holes of the pixel unit, the bridging holes of the pixel unit is allowed to share one color resist opening, thereby reducing the space occupied by the color resistor opening and improving the aperture opening ratio.

Figure 3:
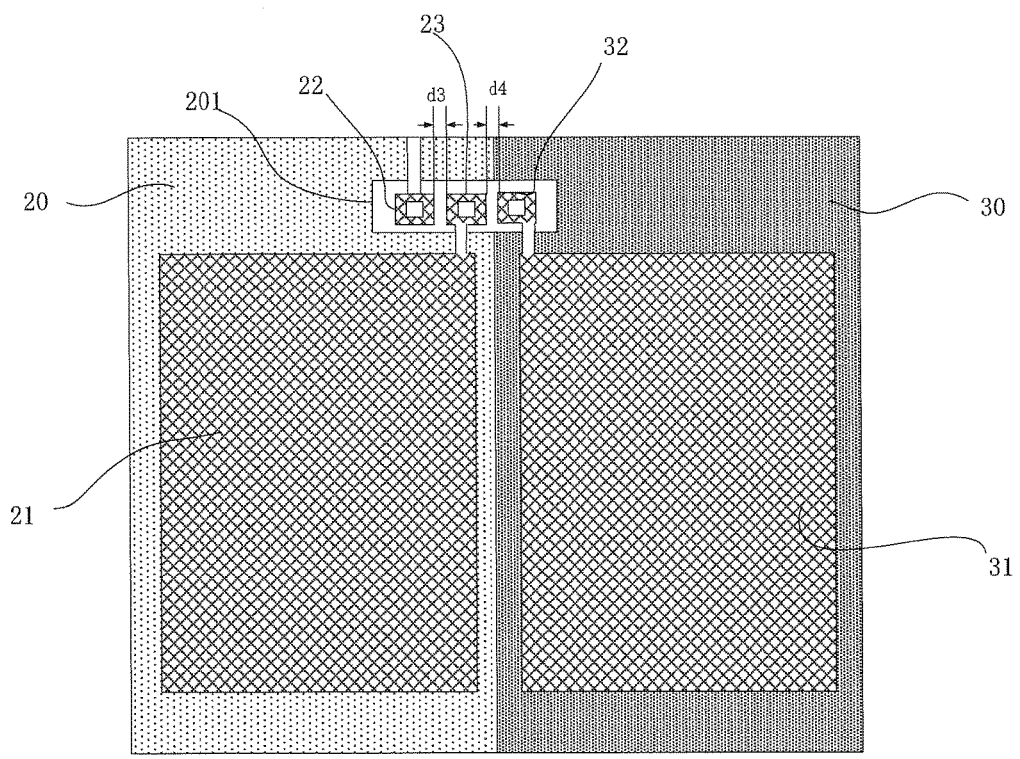
FIG. 3 is a design diagram of color resist openings in a pixel unit according to a second embodiment of the present invention.

To further reduce the space occupied by the color resist opening and thus improve the aperture opening ratio, the bridging holes of two adjacent pixel units may be allowed to share one color resist opening. Specifically, as shown in FIG. 3, in the COA substrate in this embodiment, a second pixel unit is further formed on the substrate.

The second pixel unit is configured to display a picture according to the data signal, and the second pixel unit is adjacent to the first pixel unit and has at least one bridging hole.

The second pixel unit includes a color resist layer 30 and a pixel electrode 31. The second pixel unit has one or more bridging holes, as shown in FIG. 3, a third bridging hole 32 for example.

The at least one bridging hole in the second pixel unit is included in the actual color resist opening. Specifically, the third bridging hole 32 in FIG. 3 is included in the actual color resist opening 201.

A spacing between two adjacent bridging holes, which belong to different pixel units, in the actual color resist opening is less than a sum of conventional spacings separately corresponding to the two adjacent bridging holes. Specifically, in FIG. 3, the first bridging hole 22, the second bridging hole 23 and the third bridging hole 32 are adjacent to each other successively, and are all included in the actual color resistor opening 201.

The conventional spacing corresponding to the third bridging hole 32 is set as d5, and the spacing between the second bridging hole 23 and the third bridging hole 32 in the actual color resistor opening 201 is set as d4.

In this embodiment, d3<d1+d2, and d4<d2+d5. Therefore, the bridging holes of adjacent pixel units in this embodiment may share one color resist opening, so the regions occupied by d1 and d2 may be condensed as a region occupied by d3, and the regions occupied by d2 and d5 may be condensed as a region occupied by d4, so that the space occupied by the color resist openings is further reduced and the aperture opening ratio is improved.

In practical applications, d2+d5 is generally greater than 14 μm, and d4 is thus less than 14 μm.

Preferably, for ease of arrangement of wiring and design of TFT layout, in this embodiment, d4 is greater than 7 μm but less than 14 μm.

In this embodiment, it is not limited to the case that the first pixel unit has two bridging holes and the second pixel unit has one bridging hole, and instead, it is possible that the first pixel unit has a plurality of bridging holes and the second pixel unit has a plurality of bridging holes.

Third Embodiment

Figure 4:
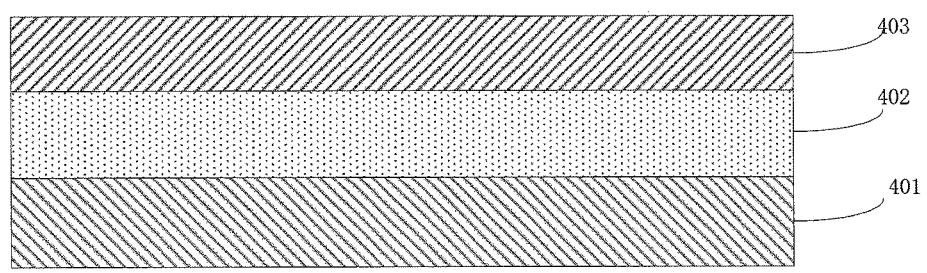
FIG. 4 is a structural diagram of a liquid crystal display panel according to a third embodiment of the present invention.

As shown in FIG. 4, this embodiment provides a liquid crystal display panel, including a COA substrate 401, a glass substrate 403, and a liquid crystal layer 402 disposed between the COA substrate 401 and the glass substrate 403, wherein the COA substrate 403 includes:

a substrate:

a scanning line, a data line and a first pixel unit all formed on the substrate, wherein, the data line is configured to transmit a data signal;

the scanning line is configured to transmit a scanning signal; and referring to FIG. 2, the first pixel unit is configured to display a picture according to the data signal line and includes:

a thin film transistor (not shown) configured to control, according to the scanning signal, whether to transmit the data signal to a corresponding pixel electrode through a drain of the thin film transistor;

a color resist layer 20, which has an actual color resist opening 201 and is configured to form a color filter;

a plurality of bridging holes for electrical connection, i.e., a first bridging hole 22 and a second bridging hole 23, each of which corresponds to a conventional spacing that is a spacing between a conventional color resist opening to which this bridging hole corresponds and this bridging hole, wherein:

a pixel electrode 21 disposed on the color resist layer 20 and electrically connected to the drain of the thin film transistor through the first bridging hole 22, the pixel electrode being configured to control corresponding liquid crystal molecules according to the data signal, wherein, the first bridging hole 22 and the second bridging hole 23 in the first pixel unit are included in the actual color resist opening 201; and a spacing between two adjacent bridging holes is less than a sum of conventional spacings separately corresponding to the two adjacent bridging holes, that is, d3<d1+d2.

Preferably, referring to FIG. 3, a second pixel unit is further formed on the substrate.

The second pixel unit is configured to display a picture according to the data signal, and the second pixel unit is adjacent to the first pixel unit and has at least one bridging hole.

The at least one bridging hole in the second pixel unit is included in the actual color resist opening.

A spacing between two adjacent bridging holes, which belong to different pixel units, in the actual color resist opening 201 is less than a sum of conventional spacings separately corresponding to the two adjacent bridging holes, that is, d4<d2+d5.

With the liquid crystal display panel of this embodiment, the space occupied by the color resist openings may be reduced, the space utilization of a TFT region may be improved, and the aperture opening ratio may be improved.

In conclusion, although the present invention has been described with reference to the preferred embodiment thereof, it is apparent to those skilled in the art that a variety of modifications and changes may be made without departing from the scope of the present invention which is intended to be defined by the appended claims.

What is claimed is:

1. A COA substrate, comprising:
a substrate;
a scanning line, a data line and a first pixel unit all formed on the substrate, wherein,
the data line is configured to transmit a data signal;
the scanning line is configured to transmit a scanning signal; and
the first pixel unit is configured to display a picture according to the data signal line and comprises:
a thin film transistor configured to control, according to the scanning signal, whether to transmit the data signal to a pixel electrode through a drain of the thin film transistor;
a color resist layer, which has an actual color resist opening and is configured to form a color filter; wherein the actual color resist opening has an opening edge;
a first bridging hole and a second bridging hole adjacent to the first bridging hole for electrical connection;
and the pixel electrode disposed on the color resist layer and electrically connected to the drain of the thin film transistor through one of the first and second bridging holes, the pixel electrode being configured to control corresponding liquid crystal molecules according to the data signal, wherein,
the first bridging hole and the second bridging hole in the first pixel unit are included in the actual color resistor opening; wherein there is a first spacing between a hole edge of the first bridging hole and the opening edge of the actual color resist opening, and there is a second spacing between a hole edge of the second bridging hole and the opening edge of the actual color resist opening; and
a spacing between the hole edge of the first bridging hole and the hole edge of the second bridging hole is less than a sum of the first spacing and the second spacing; wherein
a second pixel unit is further formed on the substrate;
the second pixel unit is configured to display a picture according to the data signal, and the second pixel unit is adjacent to the first pixel unit in a same row and has a third bridging hole; the third bridging hole in the second pixel unit is included in the actual color resist opening and adjacent to the second bridging hole; wherein there is a third spacing between a hole edge of the third bridging hole and the opening edge of the actual color resist opening; and
a spacing between the hole edge of the second bridging hole and the hole edge of the third bridging hole is less than a sum of the second spacing and the third spacing.

2. The COA substrate as claimed in claim 1, wherein the sum of the first spacing and the second spacing is greater than 14 μm, and the spacing between the hole edge of the first bridging hole and the hole edge of the second bridging hole is less than 14 μm.

3. The COA substrate as claimed in claim 2, wherein the spacing between the hole edge of the first bridging hole and the hole edge of the second bridging hole is less than 14 μm but greater than 7 μm.

4. The COA substrate as claimed in claim 1, wherein the thin film transistor includes:
a gate;
a gate insulating layer disposed on the gate;
a semiconductor layer disposed on the gate insulating layer and configured to form a channel of the thin film transistor; and
a source and the drain being located on two sides of the semiconductor layer, respectively; wherein
the color resistor layer disposed on the drain and the gate insulating layer.

5. A liquid crystal display panel comprising a COA substrate, a glass substrate and a liquid crystal layer disposed between the COA substrate and the glass substrate, wherein the COA substrate includes:
a substrate;
a scanning line, a data line and a first pixel unit all formed on the substrate, wherein,
the data line is configured to transmit a data signal;
the scanning line is configured to transmit a scanning signal; and
the first pixel unit is configured to display a picture according to the data signal line and comprises:
a thin film transistor configured to control, according to the scanning signal, whether to transmit the data signal to a pixel electrode through a drain of the thin film transistor;
a color resist layer, which has an actual color resist opening and is configured to form a color filter; wherein the actual color resist opening has an opening edge;
a first bridging hole and a second bridging hole adjacent to the first bridging hole for electrical connection;
and the pixel electrode disposed on the color resist layer and electrically connected to the drain of the thin film transistor through one of the first and second bridging holes, the pixel electrode being configured to control corresponding liquid crystal molecules according to the data signal, wherein, the first bridging hole and the second bridging hole in the first pixel unit are included in the actual color resistor opening; wherein there is a first spacing between a hole edge of the first bridging hole and the opening edge of the actual color resist opening, and there is a second spacing between a hole edge of the second bridging hole and the opening edge of the actual color resist opening; and a spacing between the hole edge of the first bridging hole and the hole edge of the second bridging hole is less than a sum of the first spacing and the second spacing; wherein a second pixel unit is further formed on the substrate;

the second pixel unit is configured to display a picture according to the data signal, and the second pixel unit is adjacent to the first pixel unit in a same row and has a third bridging hole; the third bridging hole in the second pixel unit is included in the actual color resist opening and adjacent to the second bridging hole; wherein there is a third spacing between a hole edge of the third bridging hole and the opening edge of the actual color resist opening; and a spacing between the hole edge of the second bridging hole and the hole edge of the third bridging hole is less than a sum of the second spacing and the third spacing.

6. The liquid crystal display panel as claimed in claim 5, wherein the sum of the first spacing and the second spacing is greater than 14 µm, and the spacing between the hole edge of the first bridging hole and the hole edge of the second bridging hole is less than 14 µm.

7. The liquid crystal display panel as claimed in claim 6, wherein the spacing between the hole edge of the first bridging hole and the hole edge of the second bridging hole is less than 14 µm but greater than 7 µm.

8. The liquid crystal display panel as claimed in claim 5, wherein the thin film transistor includes:

a gate;

a gate insulating layer disposed on the gate;

a semiconductor layer disposed on the gate insulating layer and configured to form a channel of the thin film transistor; and a source and the drain being located on two sides of the semiconductor layer, respectively; wherein the color resistor layer disposed on the drain and the gate insulating layer.

* * * * *